(12) United States Patent  
Choi et al.

(10) Patent No.: US 9,036,412 B2  
(45) Date of Patent: May 19, 2015

(54) MEMORY DEVICE AND METHOD OF DETERMINING READ VOLTAGE OF MEMORY DEVICE

(71) Applicant: SAMSUNG ELECTRONICS CO., LTD., Suwon-Si, Gyeonggi-Do (KR)

(72) Inventors: Myung-Hoon Choi, Suwon-Si (KR); Jae-Yong Jeong, Yongin-Si (KR); Ki-Tae Park, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 13/908,006

(22) Filed: Jun. 3, 2013

(65) Prior Publication Data

US 2014/0029355 A1  Jan. 30, 2014

(30) Foreign Application Priority Data

Jul. 24, 2012 (KR) .................. 10-2012-0080801

(51) Int. Cl.
| | |
|---|---|
| G11C 11/34 | (2006.01) |
| G11C 16/34 | (2006.01) |
| G11C 29/42 | (2006.01) |
| G11C 16/04 | (2006.01) |
| G11C 16/26 | (2006.01) |
| G11C 29/02 | (2006.01) |
| G11C 16/00 | (2006.01) |

(52) U.S. Cl.
CPC .............. *G11C 16/34* (2013.01); *G11C 29/42* (2013.01); *G11C 16/0483* (2013.01); *G11C 16/26* (2013.01); *G11C 16/3431* (2013.01); *G11C 16/349* (2013.01); *G11C 16/00* (2013.01); *G11C 29/021* (2013.01); *G11C 29/028* (2013.01)

(58) Field of Classification Search
USPC ......................................... 365/185.03, 189.05
See application file for complete search history.

(56) References Cited

U.S. PATENT DOCUMENTS

| 7,870,446 B2 | 1/2011 | Kurashige |
| 7,936,601 B2 | 5/2011 | Kang et al. |
| 2006/0026489 A1 | 2/2006 | Noda et al. |
| 2009/0222703 A1 | 9/2009 | Kurashige |
| 2011/0235415 A1* | 9/2011 | Park et al. ................. 365/185.09 |
| 2012/0134207 A1* | 5/2012 | Yoon et al. ................ 365/185.03 |
| 2013/0148435 A1* | 6/2013 | Matsunaga ............... 365/185.23 |

FOREIGN PATENT DOCUMENTS

| JP | 2001332096 | 11/2001 |
| JP | 2003323352 | 11/2003 |
| KR | 20090000463 | 1/2009 |

\* cited by examiner

*Primary Examiner* — Anthan Tran  
(74) *Attorney, Agent, or Firm* — Volentine & Whitt, PLLC

(57) ABSTRACT

A method of operating a memory device includes applying an initial read voltage to a selected wordline to perform a read operation on memory cells connected to the selected wordline, determining whether a read failure occurs with respect to one or more of the memory cells, upon determining that a read failure has occurred with respect to some of the memory cells, determining threshold voltage distribution information for distinct groups of the memory cells, and determining a new read voltage to be applied to the selected wordline based on the threshold voltage distribution information.

11 Claims, 17 Drawing Sheets

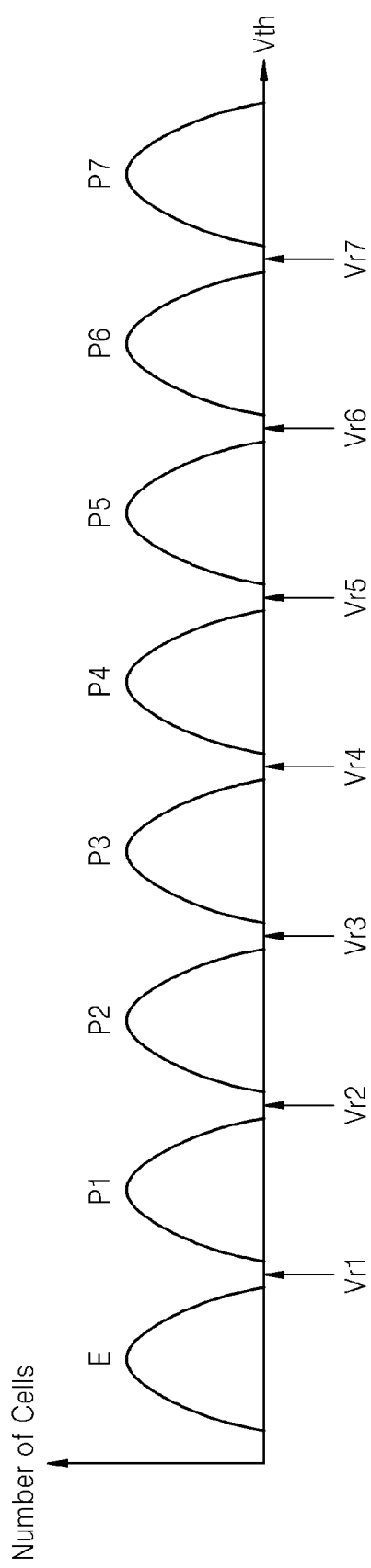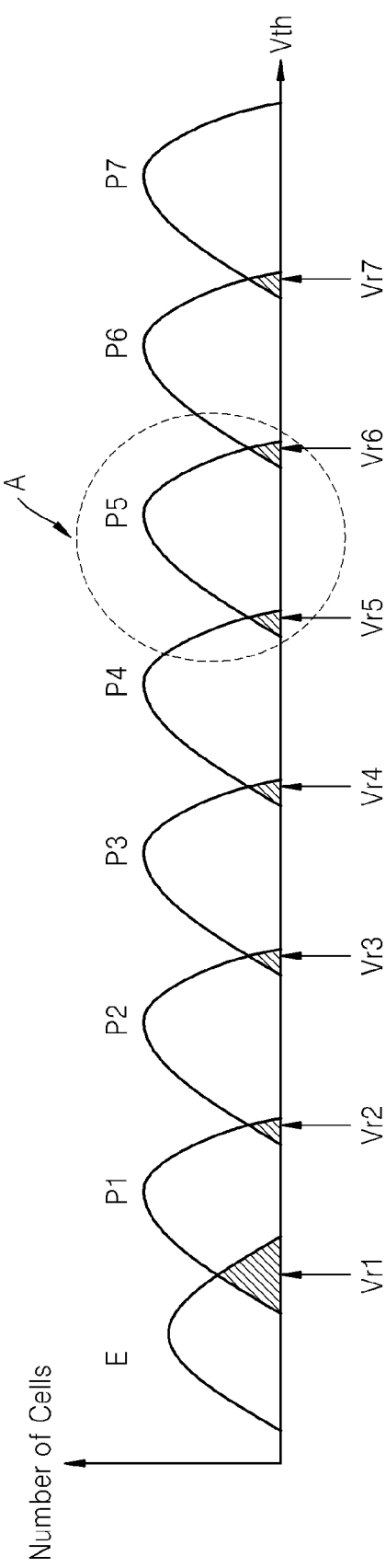

MEMORY DEVICE AND METHOD OF DETERMINING READ VOLTAGE OF MEMORY DEVICE

CROSS-REFERENCE TO RELATED APPLICATION

This application priority under 35 U.S.C. §119 to Korean Patent Application No. 10-2012-0080801 filed Jul. 24, 2012, the subject matter of which is hereby incorporated by reference.

BACKGROUND OF THE INVENTION

The inventive concept relates generally to electronic data storage technologies. More particularly, certain embodiments of the inventive concept relate to memory devices and methods that adjust read voltages according to varying threshold voltage distributions of memory cells.

There is a general demand, in many fields of electronics, to produce components with reduced size and higher performance. In the field of electronic data storage technologies, in particular, there is a demand for memory devices having smaller memory cells, higher storage capacity, faster access time, and lower power consumption, among other things.

In an effort to produce nonvolatile memory devices with relatively small size and high storage capacity, researchers have developed technologies and techniques for storing more than one bit of data per memory cell. In general, a memory device storing more than one bit of data per memory cell can be referred to as a multi-level cell (MLC) memory device. One drawback of storing more than one bit of data per memory cell is that it can reduce the reliability of the memory cells. For instance, in a flash memory device, storing more than one bit of data per memory cell may reduce the margins between adjacent threshold voltage distributions, requiring tighter operating margins and increasing the probability of read or program errors. Accordingly, as researchers continue to develop MLC memory devices, there is a related need to develop techniques and technologies to control the reliability of those devices.

SUMMARY OF THE INVENTION

In one embodiment of the inventive concept, a method of operating a memory device comprises applying an initial read voltage to a selected wordline to perform a read operation on memory cells connected to the selected wordline, determining whether a read failure occurs with respect to one or more of the memory cells, upon determining that a read failure has occurred with respect to some of the memory cells, determining threshold voltage distribution information for distinct groups of the memory cells, and determining a new read voltage to be applied to the selected wordline based on the threshold voltage distribution information.

In another embodiment of the inventive concept, a memory device comprises a memory cell array comprising a plurality of memory cells, a page buffer configured to store data that is sequentially read from the memory cells at a plurality of different voltage levels, to perform a first logic operation on the data read at adjacent voltage levels among the stored data, and to perform a second logic operation on masking patterns indicating some of the memory cells in which a read failure occurs, among the memory cells and a result of the first logic operation, and a counter configured to count a number of memory cells that are present in a plurality of sections divided by the different voltage levels based on a result of the second logic operation.

These and other embodiments of the inventive concept can potentially improve the read performance of memory devices by compensating for changes in threshold voltages of memory cells that may otherwise lead to read errors.

BRIEF DESCRIPTION OF THE DRAWINGS

The drawings illustrate selected embodiments of the inventive concept. In the drawings, like reference numbers indicate like features.

FIG. 6A is a graph illustrating threshold voltage distributions of memory cells storing 3-bit data.

FIG. 6B is a graph illustrating variation of the threshold voltage distributions of FIG. 6A.

DETAILED DESCRIPTION

Embodiments of the inventive concept are described below with reference to the accompanying drawings. These embodiments are provided as teaching examples and should not be construed to limit the scope of the inventive concept.

The terminology used herein is for the purpose of describing particular embodiments only and is not intended to be limiting of the invention. As used herein, the term "and/or" includes any and all combinations of one or more of the associated listed items, and the singular forms "a", "an" and "the" are intended to include the plural forms as well, unless the context clearly indicates otherwise. The terms "comprises" and/or "comprising," or "includes" and/or "including" where used in this specification, specify the presence of stated features, regions, integers, steps, operations, elements, and/or components, but do not preclude the presence or addition of one or more other features, regions, integers, steps, operations, elements, components, and/or groups thereof.

Although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiment.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
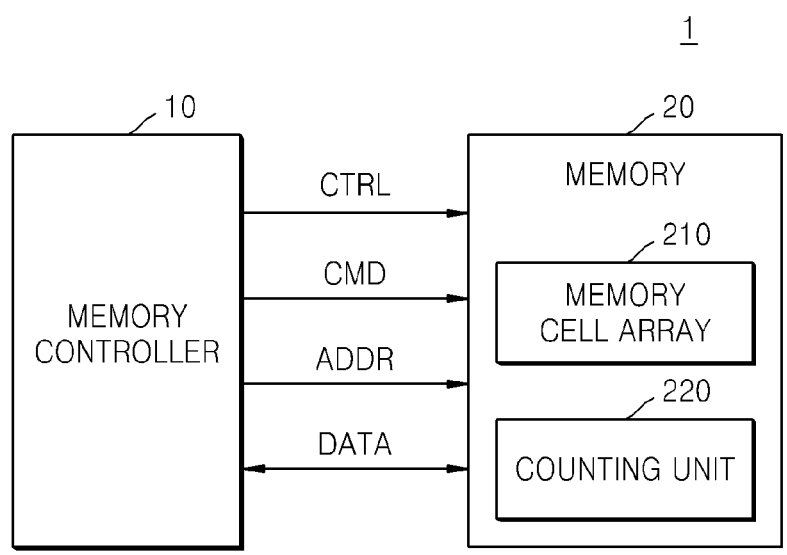
FIG. 1 is a block diagram of a memory system according to an embodiment of the inventive concept.

FIG. 1 is a block diagram of a memory system 1, according to an embodiment of the inventive concept.

Referring to FIG. 1, memory system 1 comprises a memory controller 10 and a memory device 20. Memory device 20 comprises a memory cell array 210 and a counting unit 220. Counting unit 220 is typically integrated on the same chip as memory cell array 210.

Memory controller 10 performs an operation of controlling memory device 20. For instance, memory controller 10 may control programming (or recording), reading, and erase operations of memory device 20 by supplying address signals ADDR, command signals CMD, and control signals CTRL to memory device 20. In the programming operation, memory controller 10 provides data DATA to memory device 20, and in the read operation, memory controller 10 receives data DATA from memory device 20.

Memory cell array 210 comprises a plurality of memory cells (not shown) that are disposed near areas where a plurality of wordlines (not shown) and a plurality of bitlines (not shown) cross one another. The memory cells are divided into a plurality of pages that are connected to wordlines corresponding to the pages among the wordlines. Each page may be divided into a plurality of sectors, and the size of each sector may vary. In other words, the number of memory cells in each sector may vary.

In the description that follows, it will be assumed that the memory cells (not shown) are flash memory cells, and memory cell array 210 is a NAND flash memory cell array or a NOR flash memory cell array. However, the inventive concept is not limited to flash memory, and in other embodiments, the memory cells may take other forms, such as memory cells of a resistive random access memory (RRAM), a phase change RAM (PRAM), or a magnetic RAM (MRAM).

In the flash memory cell array, memory cells are programmed by placing their respective threshold voltages in different states (e.g., an erase state or one of multiple program states), which correspond to different threshold voltage distributions. The memory cells can then be read by applying one or more read voltages to the memory cells to detect their various states. Unfortunately, the threshold voltage distributions of memory cells may vary in unintended ways due to external stimuli or wear, which can lead to read errors. For example, variation may occur if external electrical fields or breakdown of certain materials in the memory cells cause stored electrical charges to leak from the memory cells' floating gates. Nevertheless, the effects of this variation can be mitigated, in some instances, by adjusting the respective read voltages to compensate for the variation.

To determine how to adjust the read voltages, it may be necessary to determine how the threshold voltage distributions have changed over time. One way to determine this change is to perform read operations using read voltages at discrete intervals located near the margins between adjacent threshold voltage distributions. Such read operations can be used to identify memory cells with threshold voltages within each of a plurality of "sections" between the read voltages at each of the discrete intervals. For instance, if read operations are performed using read voltages at successive voltage levels Vr1 and Vr2, a memory cell that is turned on in response to read voltage Vr2, but not in response to Vr1 can be deemed to have a threshold voltage within a "section", or "threshold voltage section", between these two read voltages. Another way to express this concept is to say that the memory cell is "present" in the indicated section.

Counting unit 220 counts the number of memory cells that are present in each of a plurality of sections divided by different read voltage levels. Moreover, counting unit 220 performs the counting with respect to sub-groups of memory cells within a page. Such sub-groups, which can be a variable sized group corresponding to some or all of the memory cells in a page, can be referred to as a "variable search range" of memory cells. In certain examples, the variable search range may be one or more sectors among a plurality of sectors in a page. In this case, the variable search range may be determined based on address signals ADDR and/or data DATA.

In this way, counting unit 220 performs an operation of counting the number of memory cells that are present in each of a plurality of sections with respect to all memory cells in one page, or an operation of counting the number of memory cells that are present in each of a plurality of sections with respect to at least parts of memory cells in one page, for example, with respect to at least one or more sectors.

To perform the above counting operation, counting unit 220 performs a logic operation on data DATA read from the memory cells in each page at different voltage levels. For example, counting unit 220 performs an XOR operation on data DATA that is read from the memory cells in each page at different voltage levels. Subsequently, counting unit 220 counts the number of memory cells that are present in each of the sections by counting the number of '1's from the result of performing the XOR operation in each of the sections.

In some embodiments, memory controller 10 comprises an error correction code (ECC) processing unit (not shown). The ECC processing unit may check whether an error, i.e., a read error, exists in data DATA read from memory device 20 and may correct the read error. For example, the ECC processing unit may compare parity data that is generated and stored when data DATA is programmed, with parity data that is generated when data DATA is read, may detect an error bit of data DATA, and performs an XOR operation on the detected error bit to correct the read error.

Thus, even though, after data DATA is read from the memory cells in memory cell array 210, a read error that occurs in an initial read voltage has been corrected by the ECC processing unit, when a read failure occurs, counting unit 220 performs a counting operation and determines a desired (e.g., optimum) level of the read voltage based on the result of performing the counting operation.

Figure 2:
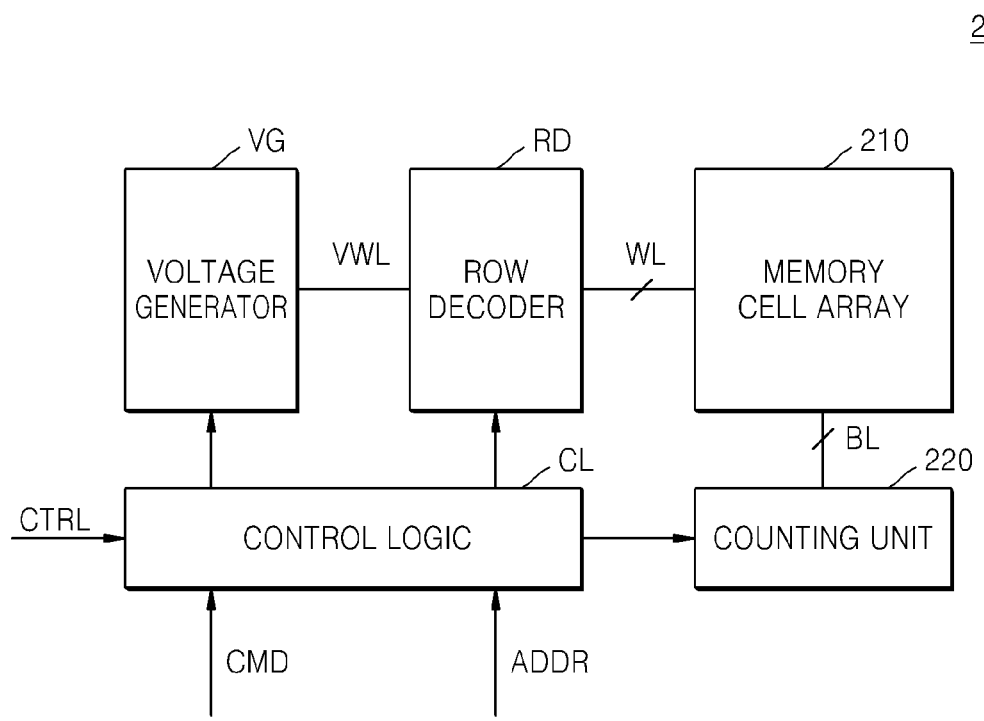
FIG. 2 is a block diagram of a memory device in the memory system of FIG. 1, according to an embodiment of the inventive concept.

FIG. 2 is a block diagram of memory device 20 of memory system 1 of FIG. 1 in detail.

Referring to FIG. 2, memory device 20 comprises memory cell array 210, counting unit 220, a control logic CL, a voltage generator VG, and a row decoder RD. Hereinafter, elements of memory device 20 will be described in detail.

Control logic CL outputs various control signals for writing or reading data DATA in memory cell array 210 based on command signals CMD, address signals ADDR, and control signals CTRL, which are received from memory controller 10. In this case, various control signals output from control logic CL may be transferred to voltage generator VG, row decoder RD, and counting unit 220.

Voltage generator VG generates driving voltages VWL for driving a plurality of wordlines WL based on the control signals received from control logic CL. Driving voltages VWL may be, for instance, write voltages (or program voltages), read voltages, erase voltages, or pass voltages.

Row decoder RD activates some of the wordlines WL based on a row address. During a read operation, row decoder RD applies a read voltage to a selected wordline WL and applies a pass voltage to an unselected wordline WL. In addition, during a write operation, row decoder RD applies a write voltage to the selected wordline WL and applies a pass voltage to the unselected wordline WL.

Counting unit 220 is connected to memory cell array 210 via a plurality of bit lines BL. Counting unit 220 counts the number of memory cells that are present in each of a plurality of sections divided by different voltage levels and may provide a counting result to memory controller 10.

Figure 3:
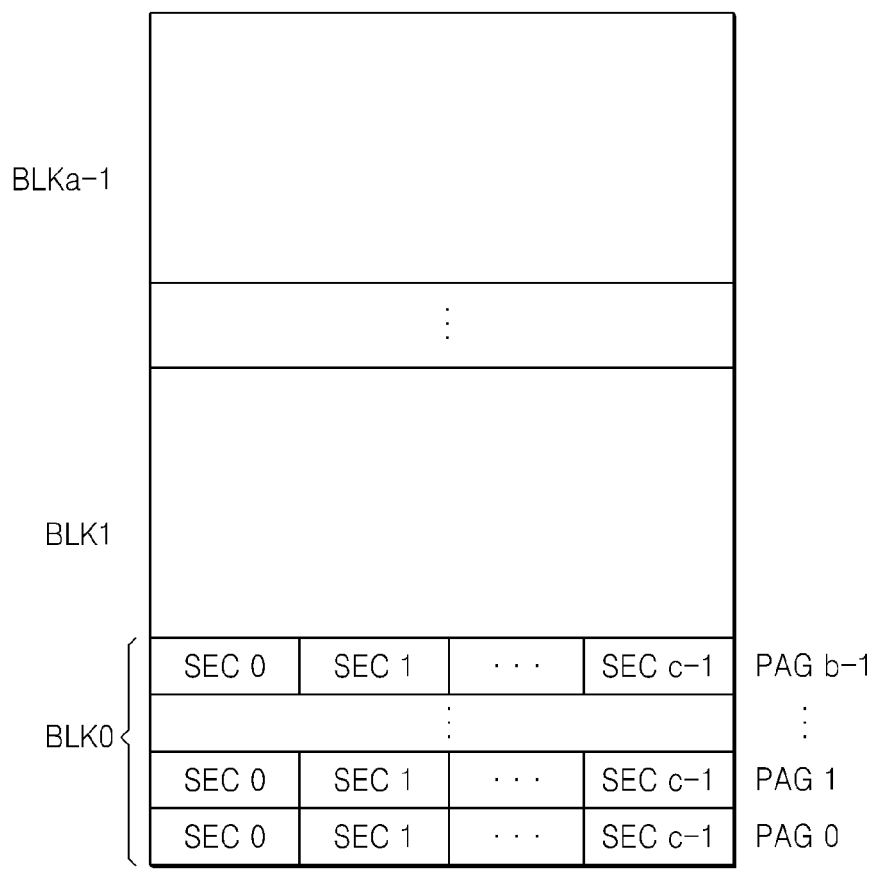
FIG. 3 illustrates a memory cell array of the memory device of FIG. 2, according to an embodiment of the inventive concept.

FIG. 3 illustrates an example of memory cell array 210 of memory device 20 of FIG. 2, according to an embodiment of the inventive concept.

Referring to FIG. 3, memory cell array 210 may be a flash memory cell array. In this example, memory cell array 210 comprises a (where a is an integer greater than or equal to 2) memory blocks BLK0 to BLKa-1, and each of the a blocks BLK0 to BLKa-1 comprises b (where b is an integer greater than or equal to 2) pages PAG0 to PAGb-1, and each of the b pages PAG0 to PAGb-1 comprises c (where c is an integer greater than or equal to 2) sectors SEC0 to SECc-1. In FIG. 3, for convenience, the b pages PAG0 to PAGb-1 and the c sectors SEC0 to SECc-1 are disposed only on block BLK0. However, the other blocks BLK1 to BLKa-1 may have the same structure as that of block BLK0.

Figure 4:
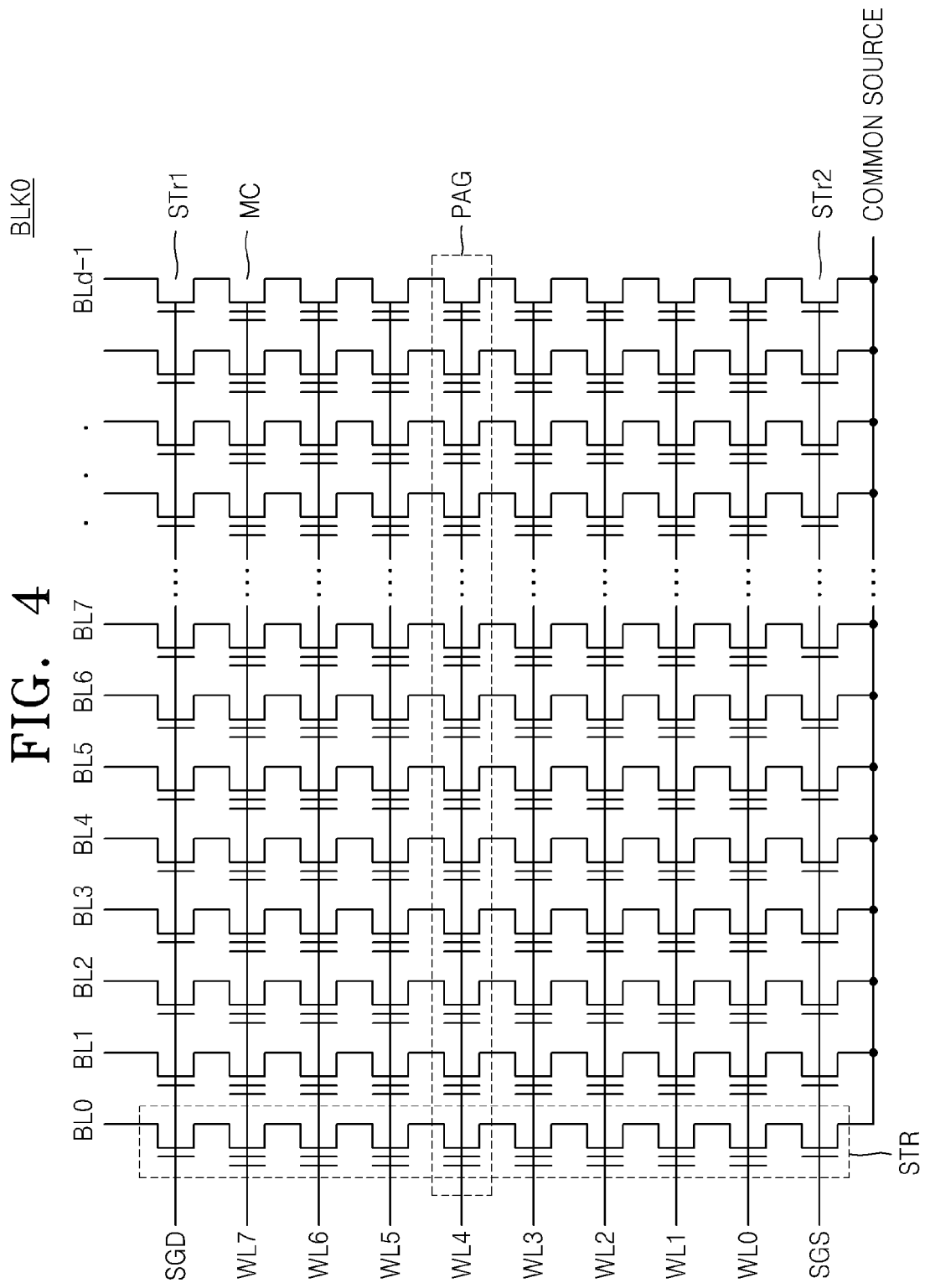
FIG. 4 is a circuit diagram of a memory block of the memory cell array of FIG. 3, according to an embodiment of the inventive concept.

FIG. 4 is a circuit diagram of memory block BLK0 of memory cell array 210 of FIG. 3, according to an embodiment of the inventive concept.

Referring to FIG. 4, memory cell array 210 comprises a memory cell array of a NAND flash memory, and each of the a blocks BLK0 to BLKa-1 of FIG. 3 is implemented as illustrated in FIG. 4. Each of the a blocks BLK0 to BLKa-1 comprises d (where d is an integer greater than or equal to 2) strings STR in which 8 memory cells MC are connected in series in directions of bitlines BL0 to BLd-1. Each of the d strings STR comprises a drain selection transistor Str1 and a source selection transistor Str2, which are connected to ends of the 8 memory cells MC connected in series.

The NAND flash memory having the structure of FIG. 4 performs an erase operation in units of blocks and performs a programming operation in units of pages PAG that correspond to wordlines WL0 to WL7. FIG. 4 illustrates an example in which 8 pages PAG corresponding to 8 wordlines WL0 to WL7 are disposed on one block. However, the a blocks BLK0 to BLKa-1 of memory cell array 210 of FIG. 3 may comprise a different number of memory cells and pages than illustrated in FIG. 4. In addition, memory device 20 of FIGS. 1 and 2 may comprise a plurality of memory cell arrays that perform the same operation as or have the same structure as that of memory cell array 210 described above.

Figure 5:
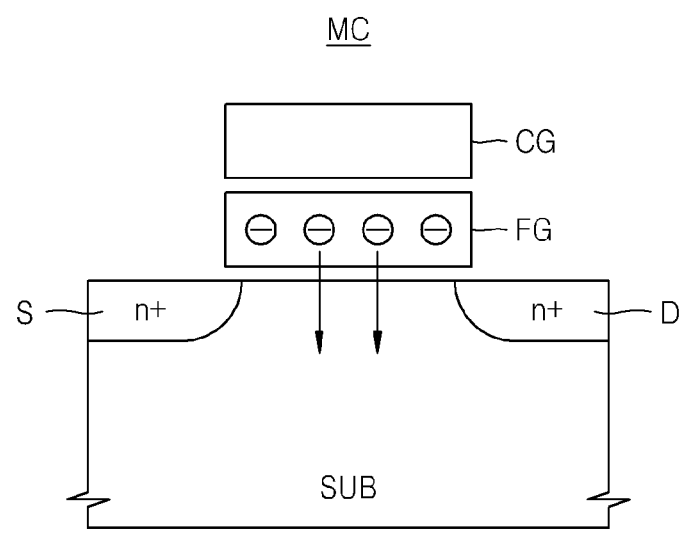
FIG. 5 is a cross-sectional view of a memory cell of the memory block of FIG. 4, according to an embodiment of the inventive concept.

FIG. 5 is a cross-sectional view of a memory cell MC of memory block BLK0 of FIG. 4, according to an embodiment of the inventive concept.

Referring to FIG. 5, a source region S and a drain region D are formed in a substrate SUB, and a channel region is formed between source region S and drain region D. A floating gate FG is formed above the channel region, and an insulating layer (not shown), such as a tunneling insulating layer, is disposed between the channel region and floating gate FG. A control gate CG is formed above floating gate FG, and an insulating layer (not shown), such as a blocking insulating layer, is disposed between floating gate FG and control gate CG. Voltages required for programming, erasing, and read operations of memory cell MC are applied to substrate SUB, source region S, drain region D, and control gate CG.

In the flash memory device, data stored in memory cell MC is read by distinguishing a threshold voltage Vth of memory cell MC. In this case, threshold voltage Vth of memory cell MC may be determined based on the amount of electrons stored in floating gate FG. In detail, as the amount of electrons stored in floating gate FG increases, the threshold voltage Vth of memory cell MC may increase.

The electrons stored in floating gate FG of memory cell MC may leak, for various reasons, in a direction indicated by an arrow. This leakage may vary the threshold voltage Vth of memory cell MC. For example, the electrons stored in floating gate FG may leak due to wear of memory cell MC. Such wear can occur due to, e.g., repeated programming, erasing, or read operation of memory cell MC, which can damage an insulating layer between the channel region and floating gate FG. The electrons stored in floating gate FG may also leak due to high-temperature stress or a difference in temperatures when the programming/read operation is performed.

FIG. 6A is a graph illustrating threshold voltage distributions of memory cells of memory device 20 where memory cell MC of FIG. 5 is a 3-bit multi-level cell.

Referring to FIG. 6A, the horizontal axis represents threshold voltages Vth, and the vertical axis represents the number of memory cells MC. Where memory cell MC is a 3-bit multi-level cell that is programmed with 3 bits, memory cell MC may be in one of an erased state E, a first programmed state P1, a second programmed state P2, and a third programmed state P3. In a multi-level cell, a distance between distributions of threshold voltages Vth is typically smaller than in a single level cell. Thus, in the multi-level cell, errors may occur due to small variations of threshold voltages Vth.

A first read voltage Vr1 is at a voltage level between respective threshold voltage distributions corresponding to erased state E and first programmed state P1. A second read voltage Vr2 is at a voltage level between respective threshold voltage distributions corresponding to first programmed state P1 and second programmed state P2. A third read voltage Vr3 is at a voltage level between respective threshold voltage distributions corresponding to second programmed state P2 and third programmed state P3. A fourth read voltage Vr4 is at a voltage level between respective threshold voltage distributions corresponding to third programmed state P3 and fourth programmed state P4. A fifth read voltage Vr5 is at a voltage level between respective threshold voltage distributions corresponding to fourth programmed state P4 and fifth programmed state P5. A sixth read voltage Vr6 is at a voltage level between respective threshold voltage distributions corresponding to fifth programmed state P5 and sixth programmed state P6. A seventh read voltage Vr7 is at a voltage level between respective threshold voltage distributions corresponding to sixth programmed state P6 and seventh programmed state P7.

For example, where first read voltage Vr1 is applied to control gate CG of memory cell MC, memory cell MC in erased state E is turned on, whereas memory cell MC in first programmed state P1 is turned off. Where memory cell MC is turned on, current flows through memory cell MC, and where memory cell MC is turned off, current does not flow through memory cell MC. Thus, data stored in memory cell MC may be distinguished depending on whether memory cell MC is turned on.

In some embodiments, a read operation may determine that, where memory cell MC is turned on by applying first read voltage Vr1 to control gate CG, data '1' is stored in memory cell MC and where memory cell MC is turned off by applying first read voltage Vr1 to control gate CG of memory cell MC, data '0' is stored in memory cell MC. However, aspects of the inventive concept are not limited thereto. For instance, in alternative embodiments, a read operation may determine that, where memory cell MC is turned on by applying first read voltage Vr1 to control gate CG of memory cell MC, data '0' is stored in memory cell MC and where memory cell MC is turned off by applying first read voltage Vr1 to control gate CG of memory cell MC, data '1' is stored in memory cell MC. In this way, allocation of logic levels of the data may vary according to embodiments.

FIG. 6B is a graph illustrating variation of the threshold voltage distributions of FIG. 6A.

Referring to FIG. 6B, memory cells MC that are programmed in an erased state E and in the first through seventh programmed states P1 to P7, respectively, may have distributions that have varied due to an external stimulus and/or wearing. In FIG. 6B, read errors may occur in memory cells MC having threshold voltages indicated by hatched portions. Thus, the reliability of memory device 20 may be lowered.

For example, when a read operation is performed on memory device 20 using first read voltage Vr1, even if memory cells MC with threshold voltages within the hatched portions are programmed in first programmed state P1, memory cells MC may be determined to be in erased state E due to a reduction in threshold voltages Vth. Thus, errors occur in the read operation, and the reliability of memory device 20 may be lowered.

When data is read from memory device 20, a raw bit error rate (RBER) varies according to a level of a read voltage. A desired level of the read voltage may be determined based on the shape of distribution of memory cells MC. Thus, as the distribution of memory cells MC varies, a desired voltage level of the read voltage for reading data from memory device 20 may vary. Thus, the desired level of the read voltage is determined by varying a level of the read voltage based on a variation in the distribution of memory cells MC. In this case, in order to effectively determine the desired level of the read voltage, an arithmetic operation has to be simplified so an arithmetic operation time and consumed power required for the arithmetic operation may be reduced.

As described above, the case where memory cells MC are each a 3-bit multi-level cell has been described with reference to FIGS. 6A and 6B. However, aspects of the inventive concept are not limited thereto, and memory cell MC of FIG. 5 may be a single level cell, a 2-bit multi-level cell, or a multi-level cell that is programmed with 4 bits or more. In addition, memory device 20 of FIGS. 1 and 2 comprises memory cells MC that are programmed with a different number of bits.

Figure 7:
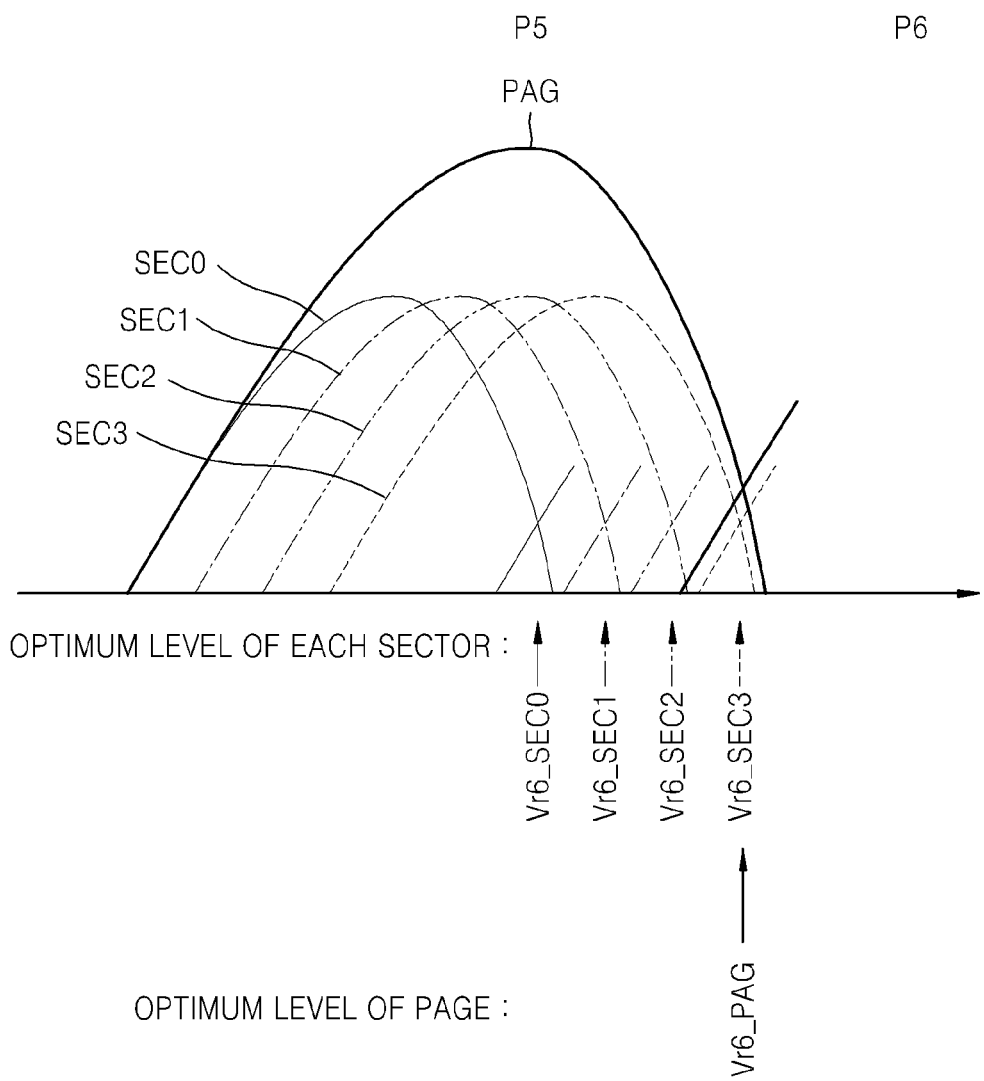
FIG. 7 is an enlarged view of a portion A in FIG. 6B, where threshold voltage distributions of memory cells are illustrated for a page and for different sectors in the page.

FIG. 7 is an enlarged view of a portion A in FIG. 6B, where threshold voltage distributions of memory cells are illustrated for a page and for different sectors in the page.

Referring to FIG. 7, because a page may be divided into a plurality of sectors, the distribution of the page may correspond to the sum of the distributions of a plurality of sectors. In one embodiment, a page PAG may be divided into four sectors SEC0, SEC1, SEC2, and SEC3, and the distribution of page PAG may correspond to the sum of the distributions of four sectors SEC0, SEC1, SEC2, and SEC3. For example, the size of page PAG may be 2048 bytes, and the size of each of the four sectors SEC0, SEC1, SEC2, and SEC3 may be 512 bytes.

As illustrated in FIG. 7, the distributions of four sectors SEC0, SEC1, SEC2, and SEC3 may be different from one another. Thus, a desired level of sixth read voltage Vr6 between fifth programmed state P5 and sixth programmed state P6 may be different in each of the four sectors SEC0, SEC1, SEC2, and SEC3. In detail, the desired level of sixth read voltage Vr6 in first sector SEC0 may be Vr6_SEC0, the desired level of sixth read voltage Vr6 in second sector SEC1 may be Vr6_SEC1, the desired level of sixth read voltage Vr6 in third sector SEC2 may be Vr6_SEC2, and the desired level of sixth read voltage Vr6 in fourth sector SEC4 may be Vr6_SEC3.

In addition, because the distribution of page PAG corresponds to the sum of distributions of four sectors SEC0, SEC1, SEC2, and SEC3, the desired level of sixth read voltage Vr6 in page PAG may be different from the desired level of sixth read voltage Vr6 in each of four sectors SEC0, SEC1, SEC2, and SEC3. In detail, the desired level of sixth read voltage Vr6 in page PAG may be Vr6_PAG.

As described above with reference to FIG. 1, memory controller 10 performs an ECC operation on data read from memory cell array 210 in each of the sectors to correct any errors. Where the ECC operation has been performed and no error has been corrected, the desired level of the read voltage is to be redetermined in a sector in which no error has been corrected. In addition, as described above with reference to FIG. 7, because the desired level of the read voltage in each of a plurality of sectors may be different from one another, the desired level of the read voltage in a sector and the desired level of the read voltage in a page including the sector may be different from each other.

Thus, instead of redetermining the desired level of the read voltage in the entire page, only the desired level of the read voltage in the sector in which no error has been corrected is to be redetermined. In this way, when the desired level of the read voltage is determined in each sector, the correction efficiency of read errors may be greatly improved compared to the case where the desired level of the read voltage in the entire page is determined.

Figure 8:
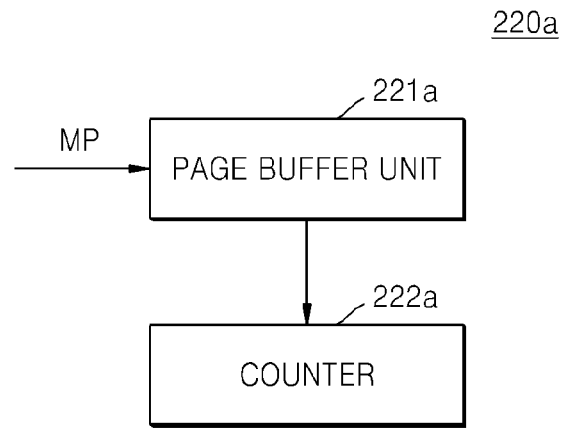
FIG. 8 is a block diagram of a counting unit of the memory device of FIG. 1, according to an embodiment of the inventive concept.

FIG. 8 is a block diagram of a counting unit 220a of memory device 20 of FIG. 1, according to an embodiment of the inventive concept.

Referring to FIGS. 1 and 8, counting unit 220a comprises a page buffer unit 221a and a counter 222a. Hereinafter, elements of counting unit 220a will be described in detail.

Page buffer unit 221a provides the results of performing logic operations on data that is read from memory cells in at least one sector among a plurality of sectors at different levels based on a masking pattern MP received from an external source. In this embodiment, page buffer unit 221a comprises a plurality of page buffers (not shown) that correspond to the number of bitlines.

Counter 222a counts the number of memory cells that are present in a plurality of sections in at least one sector, based on the results of performing the logic operations output from page buffer unit 221a. In detail, counter 222a counts the number of '1's that are present in a plurality of sections in at least one sector, based on the results of performing XOR operations output from page buffer unit 221a. In this embodiment, counter 222a performs a parallel counting operation with respect to the results of performing the logic operations output from page buffer unit 221a.

Figure 9:
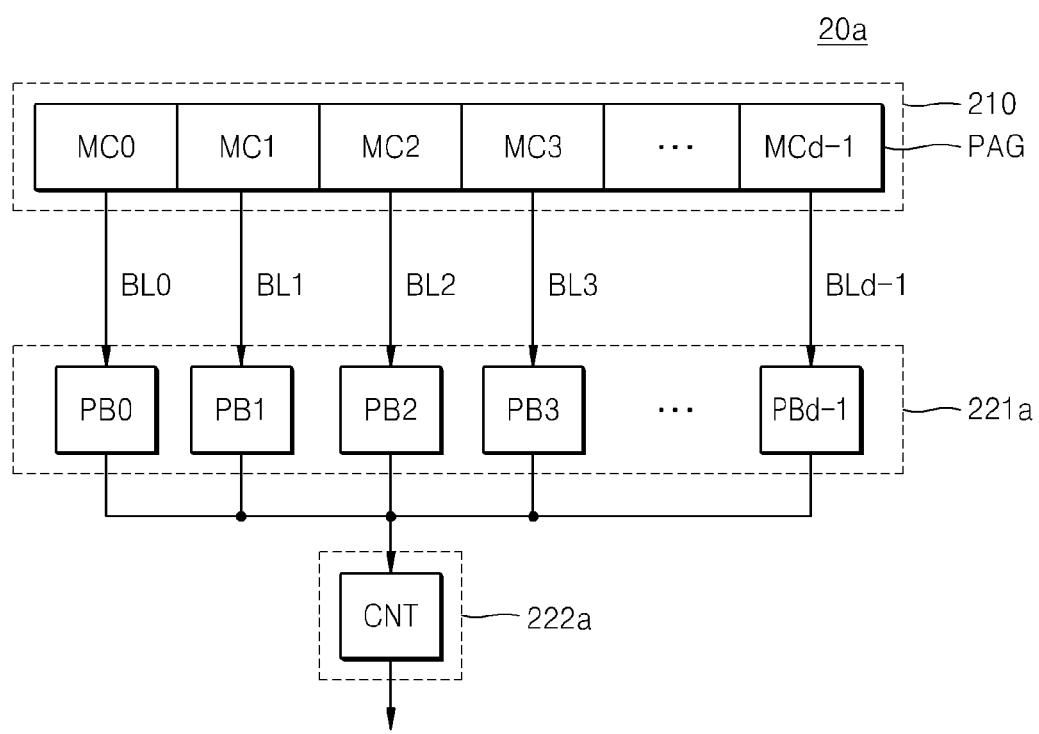
FIG. 9 is a block diagram of a memory device comprising the counting unit of FIG. 8, according to an embodiment of the inventive concept.

FIG. 9 is a block diagram of a memory device 20a comprising counting unit 220a of FIG. 8, according to an embodiment of the inventive concept.

Referring to FIG. 9, memory device 20a comprises memory cell array 210, page buffer unit 221a, and counter 222a.

Memory cell array 210 comprises a page PAG, and page PAG comprises d memory cells MC0, MC1, MC2, MC3, . . . , and MCd-1. In FIG. 9, for convenience of explanation, only one page in memory cell array 210 is shown. however, memory cell array 210 comprises a plurality of pages.

Page buffer unit 221a comprises a plurality of page buffers PB0, PB1, PB2, PB3, . . . , and PBd-1 connected to memory cells MC0, MC1, MC2, MC3, . . . , and MCd-1 via corresponding bitlines BL0, BL1, BL2, BL3, . . . , and BLd-1, respectively. Page buffers PB0, PB1, PB2, PB3, . . . , and PBd-1 temporarily store data to be written in memory cell array 210 or data read from memory cell array 210.

Where a read operation is performed on memory device 20a, each of page buffers PB0, PB1, PB2, PB3, . . . , and PBd-1 stores data that is sequentially read from each of memory cells MC0, MC1, MC2, MC3, . . . , and MCd-1 at different voltage levels. Subsequently, each of page buffers PB0, PB1, PB2, PB3, . . . , and PBd-1 performs a logic operation on the stored data. In this embodiment, each of page buffers PB0, PB1, PB2, PB3, . . . , and PBd-1 performs an XOR operation on units of data that is read at two adjacent voltage levels among different voltage levels. Subsequently, each of page buffers PB0, PB1, PB2, PB3, . . . , and PBd-1 selectively outputs the result of performing the logic operation based on masking patterns (see MP of FIG. 10) that are received from an external source.

Although not shown, each of page buffers PB0, PB1, PB2, PB3, . . . , and PBd-1 comprises a switching device, for example, an NMOS transistor. The switching device comprises a control terminal to which an output value of a page buffer is applied, for example, a gate, and an output terminal connected to counter 222a, for example, a source. Thus, where an output value of the page buffer is '1', the switching device may be turned on and supply a predetermined current to counter 222a, and where an output value of the page buffer is '0', the switching device may be turned off and may not supply the predetermined current to counter 222a.

Counter 222a counts the number of memory cells that are present in each of a plurality of sections in at least one sector, based on the result of the logic operation output from page buffer unit 221a and may output a counting result CV. In detail, counter 222a counts the number of memory cells by counting the number of '1's that are present in each of a plurality of sections in at least one sector, based on the result of the XOR operation output from page buffer unit 221a and may output the number of memory cells. In this embodiment, counter 222a performs a parallel counting operation regarding the result of the logic operation output from page buffer unit 221a.

In this embodiment, counter 222a is an analog counter. It counts the number of turned-on switching devices among switching devices in page buffers PB0, PB1, PB2, PB3, . . . , and PBd-1 by detecting the current supplied to counter 222a. In this way, counter 222a counts the number of turned-on switching devices, thereby counting the number of '1's that are present in each of a plurality of sections based on the result of the XOR operation. Thus, counter 222a counts the number of memory cells that are present in each of a plurality of sections.

Figure 10:
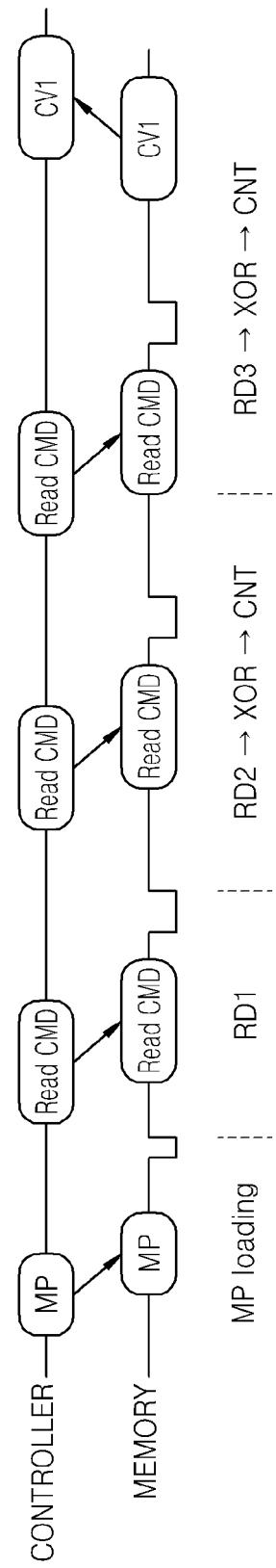
FIG. 10 is a timing diagram of an operational sequence of a memory system comprising the memory device of FIG. 9, according to an embodiment of the inventive concept.

FIG. 10 is a timing diagram of an operational sequence of memory system 1 comprising memory device 20a of FIG. 9, according to an embodiment of the inventive concept.

Referring to FIGS. 1 and 10, memory controller 10 provides masking patterns MP to memory device 20a. In detail, masking patterns MP may comprise column addresses that indicate positions of columns from which a search range in which an operation of redetermining desired levels of voltages read from the memory cells MC in page PAG is performed starts. In addition, masking patterns MP may further comprise data indicating whether search is performed on bitlines. For example, the data indicating whether search is performed on bitlines may be represented by '00001111 . . . '. Here, '0' indicates a situation where search is not performed, i.e., a situation where masking is performed, and '1' indicates a situation where search is performed.

In this way, because memory controller 10 is to provide the data indicating whether search is performed to memory device 20a, memory controller 10 provides the data to memory device 20a in the form of program commands. In this embodiment, memory controller 10 provides masking patterns MP to memory device 20a using a partial sequence of program commands.

Subsequently, memory device 20a performs a first read operation RD1 after receiving read commands Read CMD from memory controller 10. In detail, memory device 20a reads first data from memory cells MC0, MC1, MC2, MC3, . . . , and MCd-1 at a first voltage level V1, and the read first data is temporarily stored in page buffers PB0, PB1, PB2, PB3, . . . , and PBd-1, respectively.

Subsequently, memory device 20a performs a second read operation RD2, an XOR operation XOR, and a counting operation CNT after receiving read command Read CMD from memory controller 10. In detail, memory device 20a reads second data from memory cells MC0, MC1, MC2, MC3, . . . , and MCd-1 at a second voltage level V2, and the read second data is temporarily stored in page buffers PB0, PB1, PB2, PB3, . . . , and PBd-1, respectively.

Page buffers PB0, PB1, PB2, PB3, . . . , and PBd-1 perform an XOR operation on each of the first and second data and may selectively output the results of performing the XOR operation based on masking patterns MP. In detail, each of page buffers PB0, PB1, PB2, PB3, . . . , and PBd-1 performs an AND operation on the results of the XOR operation and data among data, for example, '00001111', in masking patterns MP. Thus, where data of masking patterns MP corresponding to a page buffer is '0', the results of the XOR operations are not output from the page buffer, and when data of masking patterns MP corresponding to the page buffer is '1', the results of the XOR operations are output from the page buffer.

Counter 222a counts the number of '1's that are present in a plurality of sections between first voltage level V1 and second voltage level V2, based on the results of the XOR operation that are selectively output from page buffers PB0, PB1, PB2, PB3, . . . , and PBd-1. Thus, counter 222a counts the number of memory cells MC that are present in the sections between first voltage level V1 and second voltage level V2 and generates a first counting result CV1.

Subsequently, memory device 20a performs a third read operation RD3, an XOR operation XOR, and a counting operation CNT after receiving read commands Read CMD from memory controller 10. First counting result CV1 that is generated by counter 222a is provided to memory controller 10 after third read operation RD3 is performed. Third read operation RD3, the XOR operation XOR, and counting operation CNT are substantially the same as second read operation RD2, XOR operation XOR, and counting operation CNT, so further descriptions of these features is omitted to avoid redundancy.

Figure 11:
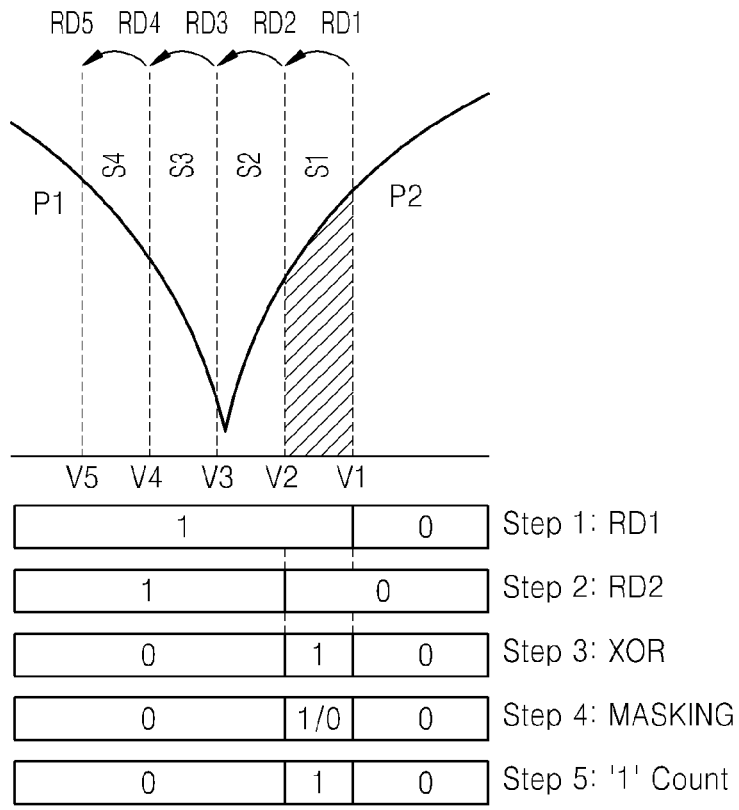
FIG. 11 illustrates an operation of the memory device of FIG. 9, according to an embodiment of the inventive concept.

FIG. 11 illustrates an operation of memory device 20a of FIG. 9 in more detail.

Referring to FIGS. 1 and 11, memory controller 10 performs an operation of determining read voltages on memory cells MC in memory device 20a to determine desired levels of the read voltages in two adjacent states. Memory controller 10 reads data from each of memory cells MC at a plurality of different voltage levels V1 to V5 between two adjacent states of memory cells MC, for example, between a first programmed state P1 and a second programmed state P2. Memory device 20a performs a logic operation on data read at two adjacent voltage levels among the voltage levels V1 to V5 and counts the number of memory cells MC that are present in each of a plurality of sections S1 to S4, based on the results of the logic operations. The operation of determining read voltages may be referred to as a minimal error search (MES) operation.

In this embodiment, although the number of different voltage levels V1 to V5 is five, the inventive concept are not limited thereto, and the number of voltage levels may vary in alternative embodiments. For example, a direction in which data is read at the voltage levels may be a direction in which voltage levels decrease from first voltage level V1 to fifth voltage level V5. However, the inventive concept are not limited thereto, and the direction in which data is read at the voltage levels may be a direction in which voltage levels increase from fifth voltage level V5 to first voltage level V1.

In a first step, data is read from each of memory cells MC in a page PAG at a first voltage level V1. In this case, units of data '1' is read from memory cells MC having lower threshold voltages Vth than first voltage level V1, and units of data '0' is read from memory cells MC having higher threshold voltages Vth than first voltage level V1. In this way, the first data read in the first step is temporarily stored in page buffers PB0, PB1, PB2, PB3, . . . , and PBd-1.

In a second step, data is read from each of memory cells MC in page PAG at a second voltage level V2. In this case, data '1' is read from memory cells MC having lower threshold voltages Vth than second voltage level V2, and data '0' is read from memory cells MC having higher threshold voltages Vth than second voltage level V2. In this way, the second data read in the second step is temporarily stored in page buffers PB0, PB1, PB2, PB3, . . . , and PBd-1.

In a third step, each of page buffers PB0, PB1, PB2, PB3, . . . , and PBd-1 performs logic operations on the first data read at first voltage level V1 and the second data read at second voltage level V2. In one embodiment, each of page buffers PB0, PB1, PB2, PB3, . . . , and PBd-1 performs XOR operations on the first and second data.

For memory cells MC having lower threshold voltages Vth than second voltage level V2, the results of the XOR operations on the first and second data is '0', and for memory cells MC having threshold voltages Vth between second voltage level V2 and first voltage level V1, the result of the XOR operation on the first and second data is '1', and for memory cells MC having higher threshold voltages Vth than first voltage level V1, the results of the XOR operations on the first and second data is '0'. Thus, it may be checked from the results of the XOR operations on the first and second data whether memory cells MC are in a first section S1 that is divided by two adjacent voltage levels V1 and V2. In detail, it may be checked that memory cells MC are in a section in which the results of the XOR operations on the first and second data is '1'.

In a fourth step, each of page buffers PB0, PB1, PB2, PB3, . . . , and PBd-1 selectively outputs the results of the XOR operations based on masking patterns MP. In detail, each of page buffers PB0, PB1, PB2, PB3, . . . , and PBd-1 performs an AND operation on the results of the XOR operations and data among data in masking patterns MP, for example, '00001111 . . . '. Thus, where data of masking patterns MP corresponding to a page buffer is '0', the results of the XOR operations is not output from the page buffer, and where data of masking patterns MP corresponding to the page buffer is '1', the results of the XOR operations is output from the page buffer.

In a fifth step, counter 222a counts the number of '1's from the results of the XOR operations performed by page buffers PB0, PB1, PB2, PB3, . . . , and PBd-1 in first section S1. Thus, counter 222a counts the number of memory cells MC that are present in first section S1.

By performing the above-described operations repeatedly, counter 222a counts the number of memory cells MC that are present in each of a plurality of sections S1, S2, S3, and S4. In this case, a voltage level corresponding to a section having the smallest number of memory cells MC among the sections S1, S2, S3, and S4 may be referred to as a valley, and memory controller 10 may determine a voltage level corresponding to the valley as a desired level of the read voltage.

Figure 12:
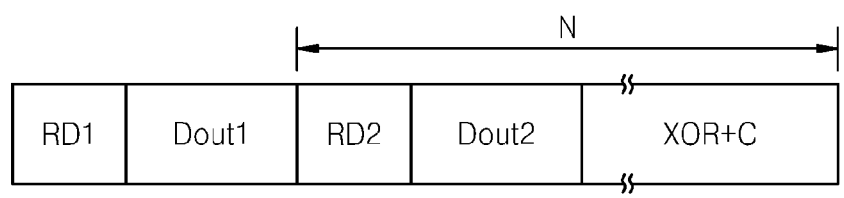
FIG. 12 illustrates an operation of a memory device in a comparative example.

FIG. 12 illustrates an operation of a memory device in a comparative example.

Referring to FIG. 12, an MES operation is performed by dividing a space between two adjacent states of memory cells into N sections (where N is a natural number greater than or equal to 2). The MES operation comprises an operation RD1 of reading first data from the memory cells at a first voltage level, an operation Dout1 of transmitting the read first data to a memory controller, an operation RD2 of reading second data from the memory cells at a second voltage level, an operation Dout2 of transmitting the read second data to the memory controller, and an operation XOR+C of performing XOR operations on the first and second data and counting the number of '1's from the results of performing the XOR operations.

For example, a time required to perform each of operations RD1 and RD2 of reading the first and second data may be about 50 μs. Where the data transmitting operations Dout1 and Dout2 are performed at 120 MHz, a time required to perform data transmitting operations Dout1 and Dout2 may be about 150 μs. Where the XOR operation and counting operation XOR+C are performed at 60 MHz, a time required to perform the XOR operation and the counting operation XOR+C may be about 205 μs. Where N is 10, a time required for entire MES operation may be about 6.25 ms.

In this way, the main factor for power consumption in the time required to perform the MES operation is the time required for data transmitting operations Dout1 and Dout2 and the time required for the XOR operation and the counting operation XOR+C. In addition, the memory controller has an additional storage space (for example, a static random access memory (SRAM) buffer) in which the transmitted first and second data is stored. Furthermore, power may be consumed to perform data transmitting operations Dout1 and Dout2 and the XOR operation and the counting operation XOR+C.

Figure 13:
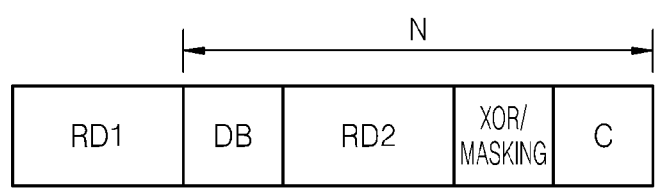
FIG. 13 illustrates an operation of the memory device of FIG. 9, according to an embodiment of the inventive concept.

FIG. 13 illustrates an operation of memory device 20a of FIG. 9, according to an embodiment of the inventive concept.

Referring to FIG. 13, in this embodiment, memory device 20a comprises page buffers PB0, PB1, PB2, PB3, . . . , and PBd-1 and counter 222a. Each of page buffers PB0, PB1, PB2, PB3, . . . , and PBd-1 performs an XOR operation, and counter 222a counts the number of '1's from the result of performing the XOR operation. Thus, where the MES operation is performed by dividing a space between two adjacent states of memory cells MC into N sections (where N is a natural number greater than or equal to 2), the MES operation comprises an operation RD1 of reading first data from memory cells MC at a first voltage level, an operation DB of storing (that is, backing up) the read first data in page buffers PB0, PB1, PB2, PB3, . . . , and PBd-1, an operation RD2 of reading second data from memory cells MC at a second voltage level, an operation XOR/MASKING of performing XOR operations and masking on the first data stored in page buffers PB0, PB1, PB2, PB3, . . . , and PBd-1 and the read second data, and an operation C of counting the number of '1's from the results of performing the XOR operations.

For example, a time required to perform each of operations RD1 and RD2 of reading the first and second data may be about 50 μs. A time required to perform the first data storing operation DB may be about 3 μs, and a time required to perform the XOR operation and counting operation C may be about 24 μs. When N is 10, a time required for entire MES operation may be about 0.8 ms, which is much less than the time according to the comparative example of FIG. 12.

In this way, because each of page buffers PB0, PB1, PB2, PB3, . . . , and PBd-1 backs up the first data, the first data does not need to be transmitted to memory controller 10 so a time required for a data transmitting operation may be saved. In addition, because each of page buffers PB0, PB1, PB2, PB3, . . . , and PBd-1 performs XOR operations on the backup first data and the read second data, the XOR operations may be performed in a parallel manner so a time required for the XOR operations may be greatly reduced.

Furthermore, each of page buffers PB0, PB1, PB2, PB3, . . . , and PBd-1 selectively provides the results of performing the XOR operations based on masking patterns MP. Thus, counter 222a receives the results of performing the XOR operations on some of memory cells MC0, MC1, MC2, MC3, . . . , and MCd-1 in a page, for example, on memory cells in at least one sector. Thus, counter 222a performs a counting operation in each of the sectors (not in the entire page), and memory controller 10 determines desired voltage levels of read voltages in each sector so the correction ratio of read errors may be significantly increased.

In addition, counter 222a is a counter that performs a high-speed operation. Counter 222a counts the number of '1's from the results of performing the XOR operations output from page buffers PB0, PB1, PB2, PB3, . . . , and PBd-1 so a time required for counting may be greatly reduced. Furthermore, memory controller 10 does not need to have additional storage space in which the read first and second data is to be stored. Thus, the size of memory controller 10 may be reduced, and power consumed for performing an operation of transmitting the first and second data may be reduced.

Figure 14:
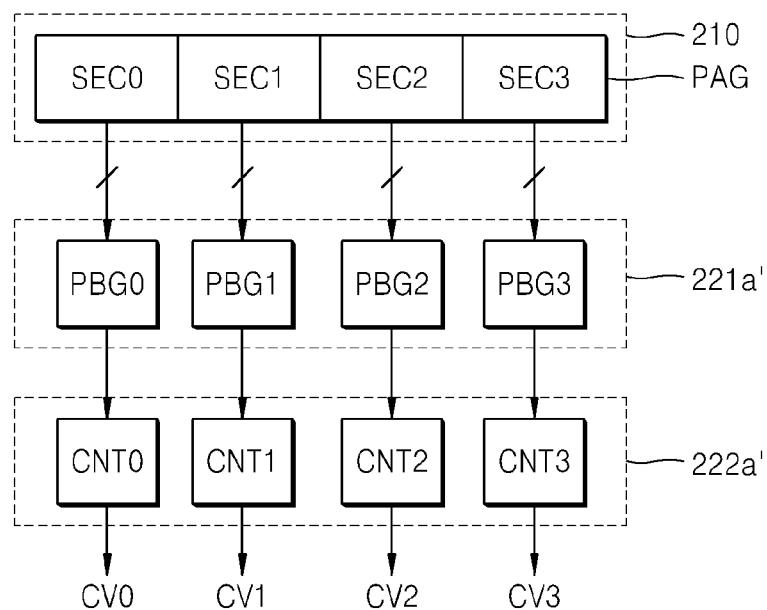
FIG. 14 is a block diagram of a memory device comprising the counting unit of FIG. 8, according to another embodiment of the inventive concept.

FIG. 14 is a block diagram of a memory device 20b comprising counting unit 220a of FIG. 8, according to another embodiment of the inventive concept.

Referring to FIG. 14, memory device 20b comprises memory cell array 210, a page buffer unit 221a', and a counter 222a'.

Memory cell array 210 comprises a page PAG, and page PAG comprising a plurality of sectors SEC0, SEC1, SEC2, and SEC3. For convenience, FIG. 14 shows only one page PAG in memory cell array 210, but memory cell array 210 may include a plurality of pages. In addition, in FIG. 14, for convenience of explanation, page PAG includes four sectors SEC0, SEC1, SEC2, and SEC3. however, aspects of the inventive concept are not limited thereto. The number of sectors in page PAG may vary, and the size of each sector may vary.

Page buffer unit 221a' comprises a plurality of page buffer groups PBG0, PBG1, PBG2, and PBG3, and page buffer groups PBG0, PBG1, PBG2, and PBG3 are connected to the sectors SEC0, SEC1, SEC2, and SEC3 via bitlines that correspond to the sectors SEC0, SEC1, SEC2, and SEC3. In this case, each of page buffer groups PBG0, PBG1, PBG2, and PBG3 comprises a plurality of page buffers (not shown), and the page buffers (not shown) may be connected to memory cells MC via bitlines that correspond to memory cells MC.

Counter 222a' comprises a plurality of counters CNT0, CNT1, CNT2, and CNT3, and counters CNT0, CNT1, CNT2, and CNT3 are connected to the page buffer groups PBG0, PBG1, PBG2, and PBG3, respectively. In this way, counter 222a' comprises counters CNT0, CNT1, CNT2, and CNT3 corresponding to the number of sectors SEC0, SEC1, SEC2, and SEC3. Counters CNT0, CNT1, CNT2, and CNT3 output counting results CV0, CV1, CV2, and CV3 regarding sectors SEC0, SEC1, SEC2, and SEC3 that correspond to the counters CNT0, CNT1, CNT2, and CNT3, respectively.

Figure 15:
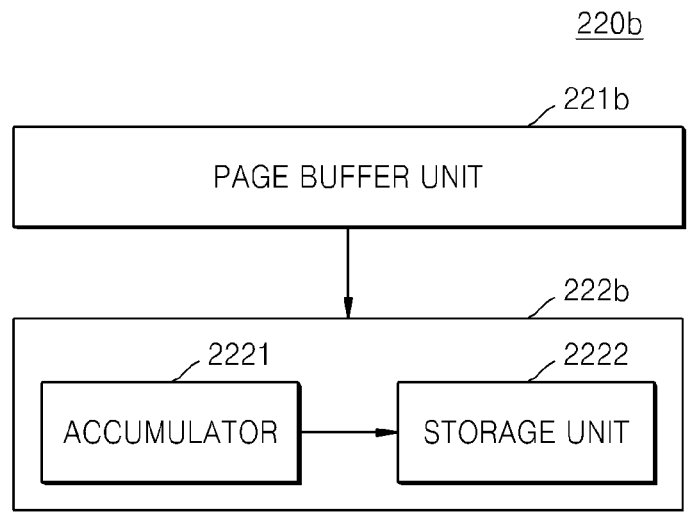
FIG. 15 is a block diagram of a counting unit of the memory device of FIG. 1, according to another embodiment of the inventive concept.

FIG. 15 is a block diagram of a counting unit 220b of memory device 20 of FIG. 1, according to another embodiment of the inventive concept.

Referring to FIG. 15, counting unit 220b comprises a page buffer unit 221b and a counter 222b. Counter 222b comprises an accumulator 2221 and a storage unit 2222.

Page buffer unit 221b stores data that is read from memory cells in each of a plurality of pages at different voltage levels and may provide the results of performing logic operations on the stored data.

Counter 222b counts the number of memory cells that are present in each of a plurality of sections in at least one sector among a plurality of sectors by sequentially receiving results of performing the logic operations output from page buffer unit 221b. In detail, counter 222b counts the number of memory cells by counting the number of '1's that are present in each of a plurality of sections from the results of the XOR operation that are sequentially output from page buffer unit 221b. In this embodiment, counter 222b performs a serial counting operation on the results of the logic operations output from the page buffers.

Accumulator 2221 sequentially outputs counting results from each of a plurality of sectors by sequentially receiving the results of the logic operations in each of the sectors from page buffer unit 221b, to storage unit 2222.

Storage unit 2222 comprises a plurality of latches (not shown), and the latches (not shown) may store counting results corresponding to the sectors. In this way, storage unit 2222 may be implemented in a form of a shift register, for example. Thus, a user may selectively obtain the counting result corresponding to a desired sector among the counting results stored in the latches.

Figure 16:
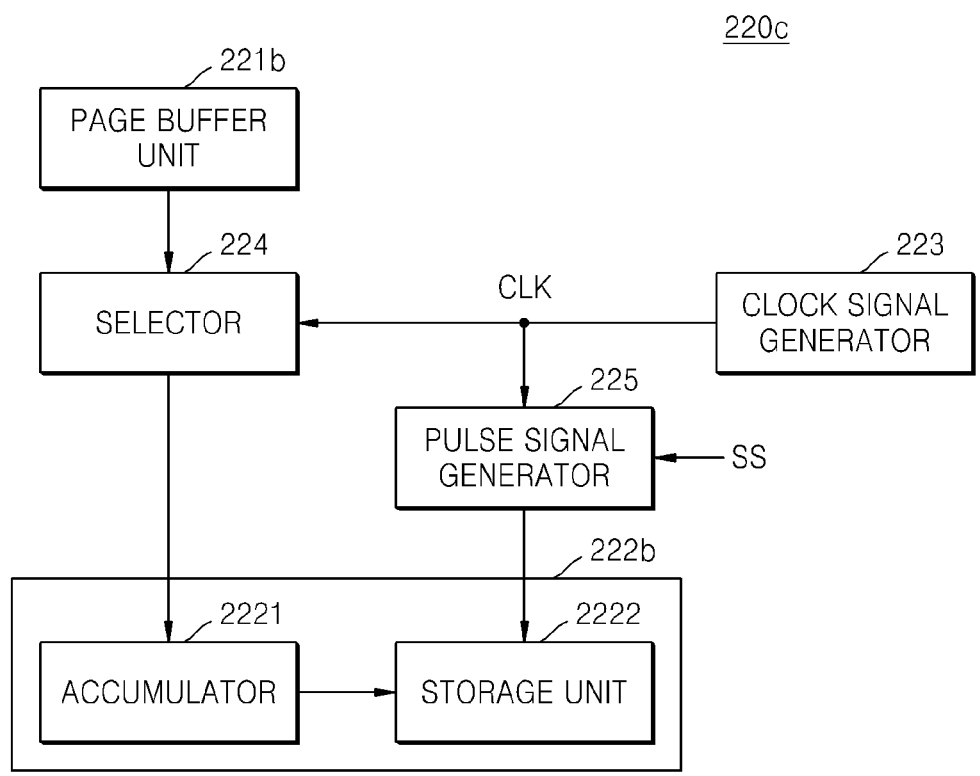
FIG. 16 is a block diagram of a counting unit of the memory system of FIG. 1, according to another embodiment of the inventive concept.

FIG. 16 is a block diagram of a counting unit 220c of memory device 20 of FIG. 1, according to another embodiment of the inventive concept.

Referring to FIG. 16, counting unit 220c comprises page buffer unit 221b, counter 222b, a clock signal generator 223, a selector 224, and a pulse signal generator 225. Counter 222b comprises accumulator 2221 and storage unit 2222. Some elements of counting unit 220c are substantially the same as the elements of counting unit 220b of FIG. 15. Like elements denote like reference numerals, and the same elements as those of counting unit 220b of FIG. 15 will not repeatedly described.

Clock signal generator 223 generates internal clock signals CLK and provides the generated internal clock signals CLK to selector 224 and pulse signal generator 225. In this case, internal clock signal CLK represents data to be currently output among units of data that are temporarily stored in page buffer unit 221b. The data to be currently output may be continuously changed by toggling of the internal clock signals CLK.

Selector 224 selects one of the results of logic operations output from the page buffers in page buffer unit 221b based on internal clock signals CLK and sequentially provides the selected result to accumulator 2221. In other words, selector 224 may operate as a data path on the results of the logic operations output from page buffer unit 221b.

Pulse signal generator 225 generates pulse signals PS indicating an end point of each of the sectors based on internal clock signals CLK and a sector size SS and provides the generated pulse signals PS to storage unit 2222. In this case, sector size SS may be provided from memory controller 10. For example, sector size SS may be 512 bytes. Pulse signal generator 225 generates pulse signals PS that are activated at a logic level '1', at the end point of each sector by counting the number of clock signals corresponding to 512 bytes from the internal clock signals CLK.

Figure 17:
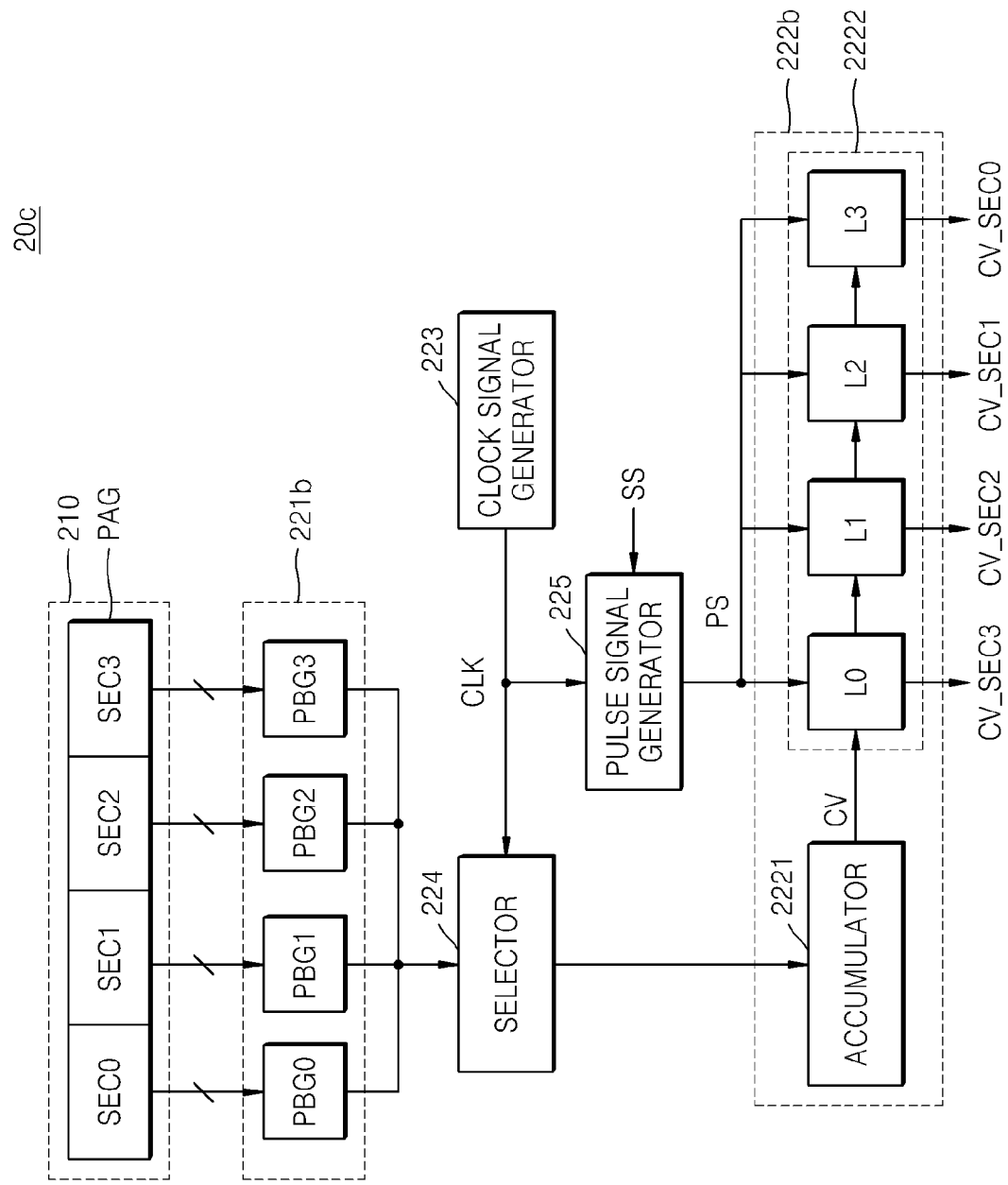
FIG. 17 is a block diagram of a memory device comprising the counting unit of FIG. 16, according to an embodiment of the inventive concept.
Figure 18:
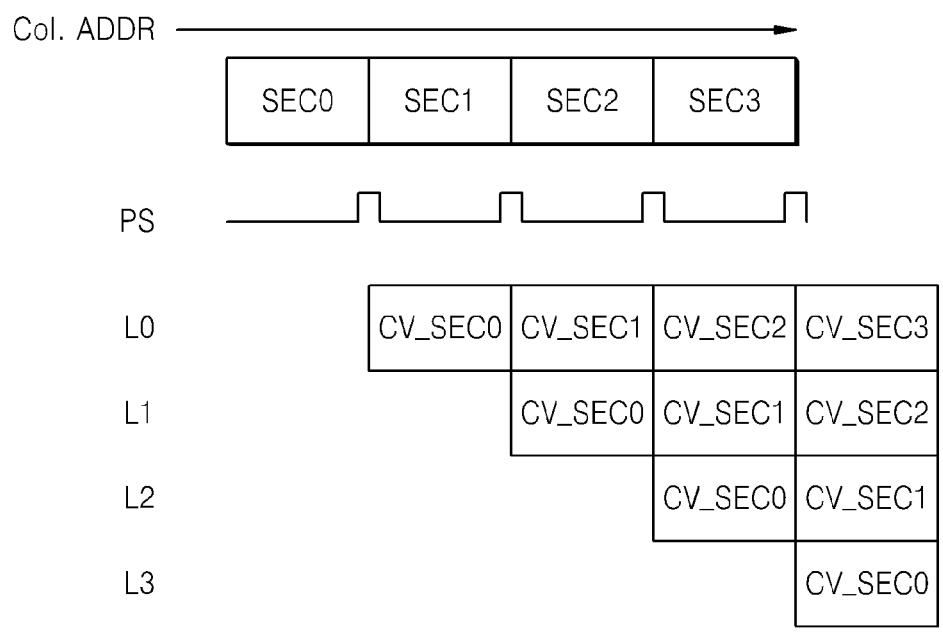
FIG. 18 illustrates pulse signals generated by a pulse signal generator of FIG. 17 and a counting result latched at a plurality of latches.

FIG. 17 is a block diagram of a memory device 20c comprising counting unit 220c of FIG. 16, according to another embodiment of the inventive concept. FIG. 18 illustrates pulse signals generated by pulse signal generator 225 of FIG. 17 and counting results latched at a plurality of latches L0, L1, L2, and L3.

Referring to FIGS. 17 and 18, memory device 20c comprises memory cell array 210, page buffer unit 221b, a counter 222b, clock signal generator 223, selector 224, and pulse signal generator 225.

Memory cell array 210 comprises a page PAG, and page PAG comprises a plurality of sectors SEC0, SEC1, SEC2, and SEC3. Sectors SEC0, SEC1, SEC2, and SEC3 follow the order of column addresses Col. ADDR. In other words, page PAG comprises sectors SEC0, SEC1, SEC2, and SEC3 that are arranged in the order of column addresses Col. ADDR.

In FIG. 17, for convenience of explanation, only one page PAG in memory cell array 210 is shown. However, memory cell array 210 may comprise a plurality of pages. In addition, in FIG. 17, for convenience of explanation, page PAG comprises four sectors SEC0, SEC1, SEC2, and SEC3. however, aspects of the inventive concept are not limited thereto, and the number and size of sectors in page PAG may vary.

Page buffer unit 221b comprises a plurality of page buffer groups PBG0, PBG1, PBG2, and PBG3, and page buffer groups PBG0, PBG1, PBG2, and PBG3 are connected to sectors SEC0, SEC1, SEC2, and SEC3, respectively, via bit-lines that correspond to sectors SEC0, SEC1, SEC2, and SEC3. In this case, each of the page buffer groups PBG0, PBG1, PBG2, and PBG3 may comprise a plurality of page buffers (not shown), and the page buffers (not shown) may be connected to memory cells MC via bitlines that correspond to memory cells MC.

Clock signal generator 223 generates internal clock signals CLK, and the generated internal clock signals CLK are provided to selector 224 and pulse signal generator 225. In this case, internal clock signals CLK represent data to be currently output among units of data that are temporarily stored in page buffer unit 221b. The data to be currently output may be continuously changed by toggling of the internal clock signals CLK.

Selector 224 receives internal clock signals CLK, selects data corresponding to the received internal clock signals CLK among page buffer groups PBG0, PBG1, PBG2, and PBG3, and outputs the selected data sequentially. In detail, selector 224 may select one of page buffer groups PBG0, PBG1, PBG2, and PBG3 based on internal clock signals CLK and may output data, i.e., the results of XOR operations, sequentially.

Pulse signal generator 225 receives internal clock signals CLK and sector size SS and generates pulse signals PS indicating an end point of each of a plurality of sectors. As illustrated in FIG. 18, pulse signals PS comprise a pulse that is activated to a logic level '1' at an end point of a first sector SEC0, a pulse that is activated to a logic level '1' at an end point of a second sector SEC1, a pulse that is activated to a logic level '1' at an end point of a third sector SEC2, and a pulse that is activated to a logic level '1' at an end point of a fourth sector SEC3.

Accumulator 2221 receives the results of XOR operations output from selector 224 sequentially and outputs counting results CV to the sectors sequentially. In this case, counting results CV output from accumulator 2221 are provided to storage unit 2222, or more specifically, to a first latch L0 in storage unit 2222.

Storage unit 2222 comprises a plurality of latches L0, L1, L2, and L3, and the latches L0, L1, L2, and L3 receive pulse signals PS. Thus, latches L0, L1, L2, and L3 latch counting results CV corresponding to sectors. In detail, first latch L0 latches a counting result CV_SEC3 corresponding to fourth sector SEC3, second latch L1 latches a counting result CV_SEC2 corresponding to third sector SEC2, third latch L2 latches a counting result CV_SEC1 corresponding to second sector SEC1, and fourth latch L3 latches a counting result CV_SEC0 corresponding to first sector SEC1. In this way, storage unit 2222 may be implemented with a shift register.

In this embodiment, because latches L0, L1, L2, and L3 latch counting results CV corresponding to the sectors SEC0, SEC1, SEC2, and SEC3, all of counting results CV corresponding to the sectors SEC0, SEC1, SEC2, and SEC3 may be obtained by performing one operation. In addition, counting result CV corresponding to each sector may be selectively obtained by selecting one of the latches L0, L1, L2, and L3.

Figure 19:
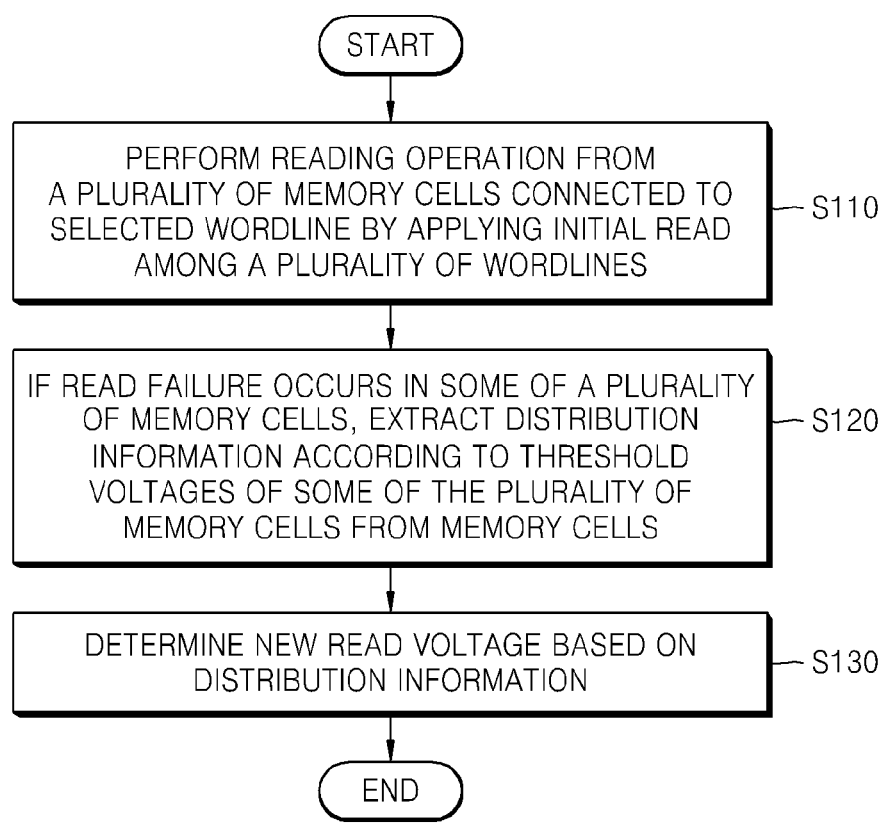
FIG. 19 is a flowchart illustrating a method of determining a read voltage of a memory device, according to an embodiment of the inventive concept.

FIG. 19 is a flowchart illustrating a method of determining a read voltage of a memory device, according to an embodiment of the inventive concept.

Referring to FIG. 19, the method of determining a read voltage of a memory device, according to this embodiment, is a method of determining a read voltage to read data stored in a memory cell array in the memory device. The descriptions of the memory device and the memory system of FIGS. 1 through 18 also apply to the method of determining a read voltage of a memory device of FIG. 19.

In operation S110, a read operation is performed on a plurality of memory cells connected to a selected wordline by applying an initial read voltage to the selected wordline among a plurality of wordlines. The memory cells may be divided into a plurality of groups, and some of the memory cells may be memory cells in which a read failure occurs from the result of ECC processing among a plurality of groups. The groups each may correspond to basic units of ECC processing on the memory device.

In operation S120, if a read failure occurs in some of the memory cells, distribution information according to threshold voltages of some of the memory cells are extracted from the memory cells. In detail, distribution information according to threshold voltages of some of the memory cells may be extracted from the memory cells based on masking patterns indicating some of the memory cells. In this case, the masking patterns are received from an external source, and the received masking patterns are stored in a page buffer of the memory device. In this case, the masking patterns may be in a partial sequence of program commands input from the memory controller to the memory device.

In one embodiment, an operation of extracting distribution information comprises sequentially performing read operations at a plurality of different voltage levels on a plurality of memory cells and performing first logic operations on data that is read at two adjacent voltage levels among the different voltage levels. In this case, the operation of performing the first logic operations comprises performing XOR or XNOR operations on the read data, and the XOR or XNOR operations may be performed by a page buffer in the memory device.

In some embodiments, the operation of extracting distribution information comprises performing second logic operations on the masking patterns indicating some of memory cells and the results of the first logic operations and counting the number of memory cells that are present in a plurality of sections divided by the different voltage levels based on the results of the second logic operations.

In some embodiments, the memory device comprises a plurality of page buffers corresponding to the number of bitlines, and each of the page buffers performs second logic operations. In addition, the operation of counting the number of memory cells that are present in the sections may include performing parallel counting on the results of the second logic operations output from the page buffers.

In some embodiments, the memory device comprises a plurality of page buffers corresponding to the number of bitlines, and each of the page buffers performs the second logic operations. In addition, the operation of counting the number of memory cells that are present in a plurality of sections comprises performing serial counting on the results of the second logic operations output from the page buffers.

In operation S130, a new read voltage is determined based on the distribution information. In detail, a voltage at a level corresponding to a section in which the smallest number of memory cells are arranged, among a plurality of sections, may be determined as the new read voltage. Operations S110 through S130 may be repeatedly performed until there is no read failure with respect to the plurality of memory cells.

Figure 20:
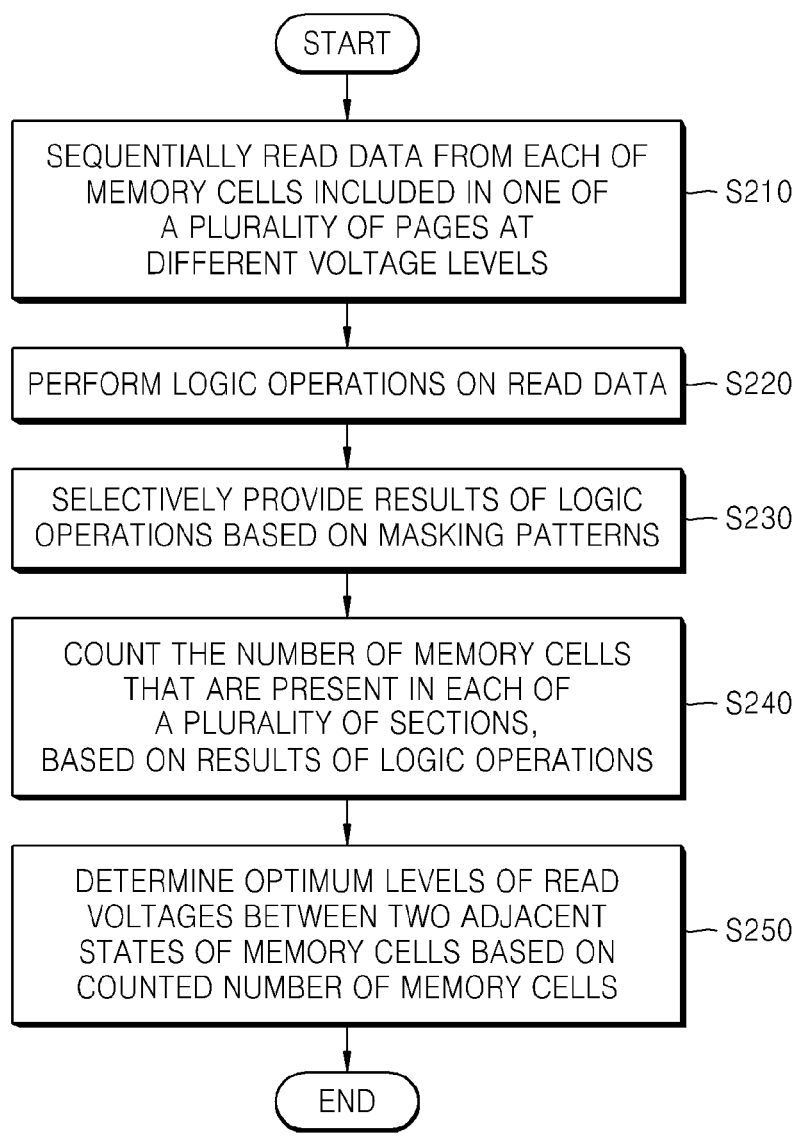
FIG. 20 is a flowchart illustrating a method of determining a read voltage of a memory device, according to another embodiment of the inventive concept.

FIG. 20 is a flowchart illustrating a method of determining a read voltage of a memory device, according to another embodiment of the inventive concept.

Referring to FIG. 20, the method determines a read voltage to read data stored in a memory cell array in the memory device. The descriptions of the memory device and the memory system of FIGS. 1 through 18 also apply to the method of determining a read voltage of a memory device of FIG. 20.

In operation S210, data is sequentially read from each of memory cells in one of a plurality of pages at different voltage levels. In operation S220, logic operations are performed on the read data. For example, XOR operations on the read data may be performed. In operation S230, the results of the logic operations are selectively provided based on masking patterns. For example, an AND operation on the results of the XOR operations and data in the masking patterns may be performed.

In operation S240, the number of memory cells that are present in each of a plurality of sections and are divided by different voltage levels is counted based on the results of the logic operations selectively provided. In operation S250, desired levels of read voltages between two adjacent states of the memory cells are determined based on the counted number of memory cells.

Figure 21:
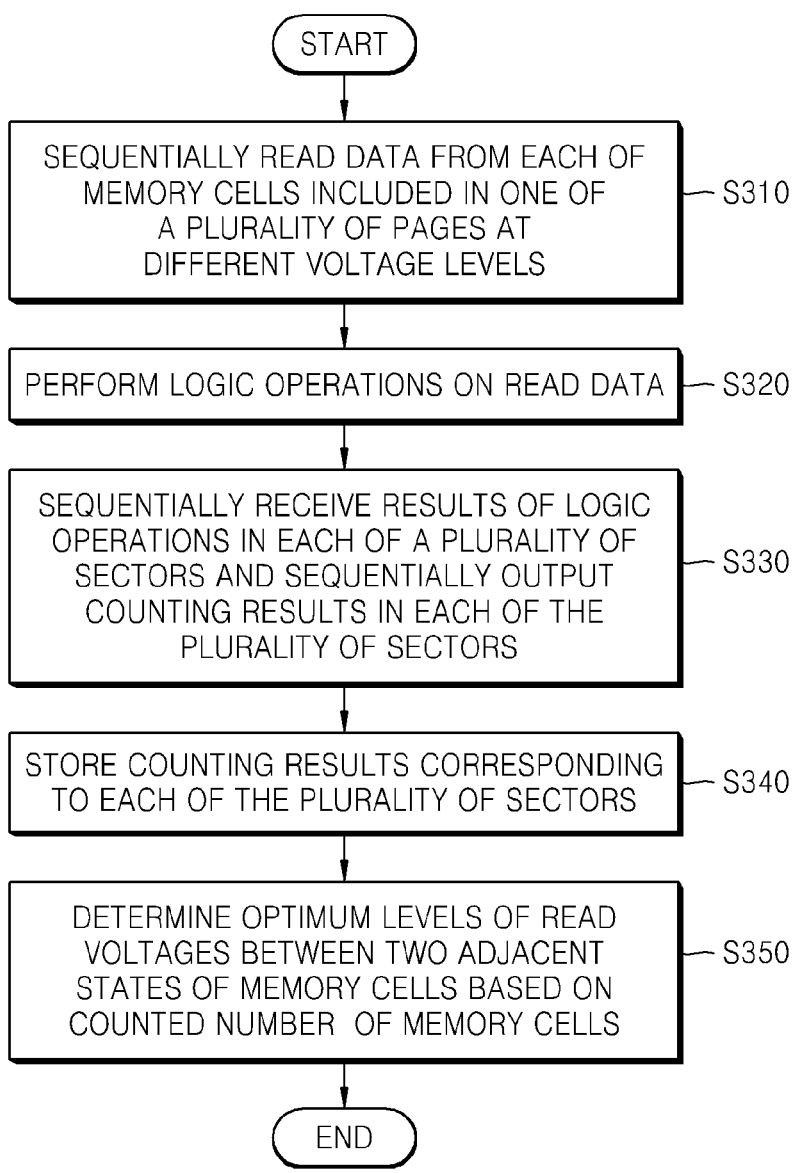
FIG. 21 is a flowchart illustrating a method of determining a read voltage of a memory device, according to another embodiment of the inventive concept.

FIG. 21 is a flowchart illustrating a method of determining a read voltage of a memory device, according to another embodiment of the inventive concept.

Referring to FIG. 21, the method determines a read voltage to read data stored in a memory cell array in the memory device. The descriptions of the memory device and the memory system of FIGS. 1 through 18 also apply to the method of determining a read voltage of a memory device of FIG. 21.

In operation S310, units of data are sequentially read from each of a plurality of memory cells in one of a plurality of pages at different voltage levels. In operation S320, logic operations are performed on the read data. For example, XOR operations on the read data may be performed. In operation S330, the results of the logic operations in each of a plurality of sectors in one of a plurality of pages are sequentially received, and counting results in each of the sectors are sequentially output. In operation S340, the counting results corresponding to each of the sectors are stored. In operation S350, desired levels of read voltages between two adjacent states of the memory cells are determined based on the counted number of memory cells.

Figure 22:
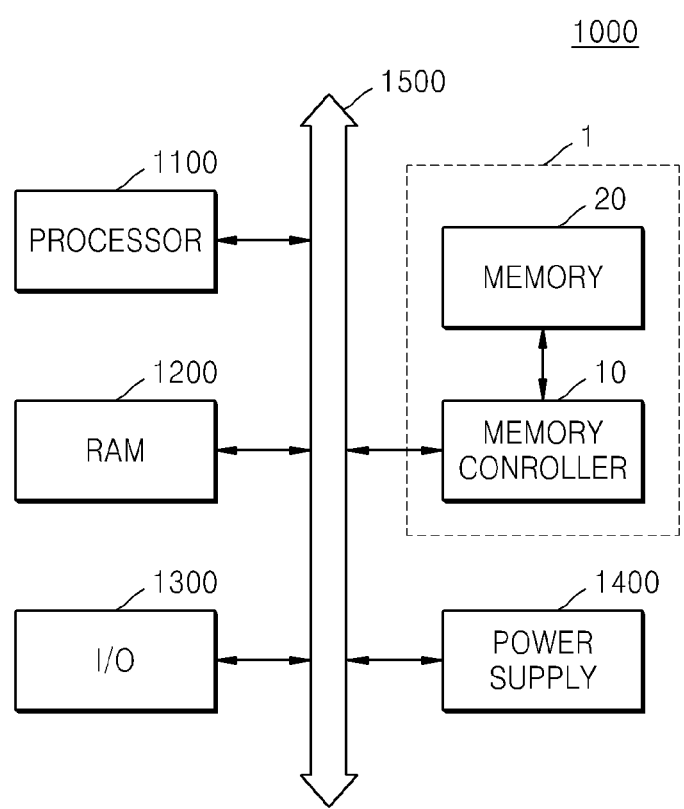
FIG. 22 is a block diagram of a computing system including the memory system of FIG. 1, according to an embodiment of the inventive concept.

FIG. 22 is a block diagram of a computing system 1000 comprising memory system 1 of FIG. 1, according to an embodiment of the inventive concept.

Referring to FIG. 22, computing system 1000 comprises a processor 1100, a RAM 1200, an input/output device 1300, a power supply device 1400, and memory system 1. Although not shown, computing system 1000 further comprises ports that may communicate with video cards, sound cards, memory cards, universal serial bus (USB) devices, or other electronic devices. computing system 1000 may be implemented as a personal computer (PC), or a portable electronic device, such as a notebook computer, a mobile phone, a personal digital assistant (PDA), a camera, or the like.

Processor 1100 performs predetermined calculations or tasks. In one embodiment, processor 1100 may be a microprocessor or a central processing unit (CPU). processor 1100 performs communication with RAM 1200, the input/output device 1300, and memory system 1 via an address bus, a control bus, a databus, or the like. In one embodiment, processor 1100 may be connected to an extension type computer bus, such as a Peripheral Component Interconnect (PCI) bus.

RAM 1200 may store data required for an operation of computing system 1000. For example, RAM 1200 may be implemented with a DRAM, a mobile DRAM, an SRAM, a PRAM, an FRAM, an RRAM and/or an MRAM.

Input/output device 1300 comprises an input unit, such as a keyboard, a keypad, a mouse, or the like, and an output unit, such as a printer, a display, or the like. power supply device 1400 may supply operating voltages required for the operation of computing system 1000.

As another example, memory devices 20, 20a, 20b, and 20c of FIGS. 2, 9, 14, and 17 and memory system 1 of FIG. 1 may be provided as one of various elements of an electronic device, such as a computer, an ultra mobile personal computer (UMPC), a workstation, a netbook, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) reproducing device, a digital audio recorder, a digital audio player, a digital picture recorder, a digital video player, and a device for transmitting/receiving information in a wireless environment, one of various electronic devices that constitute a home network, one of various electronic devices that constitute a computer network, one of various electronic devices that constitute a telematics network, a radio-frequency identification (RFID) device, or one of various elements that constitute a computing system.

In addition, memory devices 20, 20a, 20b, and 20c of FIGS. 2, 9, 14, and 17 and memory system 1 of FIG. 1 may be mounted using packages having various types, shapes, or configurations. For example, memory devices 20, 20a, 20b, and 20c of FIGS. 2, 9, 14, and 17 and memory system 1 of FIG. 1 may be mounted using packages, such as package on packages (POPs), ball grid arrays (BGAs), chip scale packages (CSPs), plastic leaded chip carrier (PLCC), plastic dual in-line packages (PDIPs), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline (TSOP), system in package (SIP), multi chip package (MCP), wafer-level fabricated package (WFP), wafer-level processed stack package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a memory device, comprising:
    applying an initial read voltage to a selected wordline to perform a read operation on memory cells connected to the selected wordline;
    determining whether a read failure occurs with respect to one or more of the memory cells;
    upon determining that a read failure has occurred with respect to some of the memory cells, determining threshold voltage distribution information for distinct groups of the memory cells; and
    determining a new read voltage to be applied to the selected wordline based on the threshold voltage distribution information,
    wherein the determining of the threshold voltage distribution information comprises
    sequentially performing a read operation on the memory cells at a plurality of different voltage levels,
    performing a first logic operation on data read at two adjacent voltage levels among the different voltage levels,
    performing a second logic operation on masking patterns indicating some of the memory cells and a result of the first logic operation, and
    counting a number of memory cells that are present in a plurality of sections divided by the different voltage levels based on a result of the second logic operation.

2. The method of claim 1, wherein the some of the memory cells comprises memory cells in which a failure has occurred in an error correction code (ECC) processing operation.

3. The method of claim 1, wherein the groups each correspond to a basic unit of ECC processing of the memory device.

4. The method of claim 1, wherein the masking patterns are received from outside the memory device, and the received masking patterns are stored in a page buffer in the memory device.

5. The method of claim 1, wherein the masking patterns are in a partial sequence of program commands input from the memory controller to the memory device.

6. The method of claim 1, wherein the first logic operation comprises an XOR operation or an XNOR operation, and the XOR operation or XNOR operation is performed by a page buffer in the memory device.

7. The method of claim 1, wherein the memory device comprises a plurality of page buffers corresponding to a number of bitlines connected to the memory cells,
    each of the page buffers performs the second logic operation, and
    the counting of the number of memory cells that are present in the sections comprises performing parallel counting on results of second logic operations output from the page buffers.

8. The method of claim 1, wherein the memory device comprises a plurality of page buffers corresponding to the number of bitlines,
    each of the page buffers performs the second logic operation, and
    the counting of the number of memory cells that are present in the sections comprises performing serial counting on results of second logic operations output from the page buffers.

9. The method of claim 1, wherein the determining of the new read voltage comprises determining a voltage at a level corresponding to a section in which a smallest number of memory cells are arranged, among the sections as the new read voltage based on a result of the counting.

10. The method of claim 1, wherein the performing of the read operation on the memory cells, the determining of the threshold voltage distribution information, and the determining of the new read voltage are repeatedly performed until no read failure occurs among the memory cells.

11. The method of claim 1, wherein the threshold voltage distribution information comprises an indication of sub-threshold voltage distributions corresponding to a common program state of the memory device.

* * * * *